(12) United States Patent
Maa et al.

(10) Patent No.: US 7,390,725 B2
(45) Date of Patent: *Jun. 24, 2008

(54) STRAINED SILICON ON INSULATOR FROM FILM TRANSFER AND RELAXATION BY HYDROGEN IMPLANTATION

(75) Inventors: Jer-shen Maa, Vancouver, WA (US);
Jong-Jan Lee, Camas, WA (US);
Douglas J. Tweet, Camas, WA (US);
David R. Evans, Beaverton, OR (US);
Allen W. Burmaster, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 316 days.

This patent is subject to a terminal disclaimer.

(21) Appl. No.: 11/284,326

(22) Filed: Nov. 21, 2005

(65) Prior Publication Data

US 2006/0073708 A1    Apr. 6, 2006

Related U.S. Application Data

(62) Division of application No. 10/755,615, filed on Jan. 12, 2004, now Pat. No. 6,992,025.

(51) Int. Cl.
*H01L 21/46* (2006.01)
*H01L 21/30* (2006.01)
(52) U.S. Cl. .................... 438/458; 257/E21.568
(58) Field of Classification Search ............. 438/458; 257/E21.568
See application file for complete search history.

(56) References Cited

U.S. PATENT DOCUMENTS

| 5,882,987 | A | 3/1999 | Srikrishnan |
| 6,156,624 | A | 12/2000 | Yamagata et al. |
| 6,486,008 | B1 | 11/2002 | Lee |
| 6,524,935 | B1 * | 2/2003 | Canaperi et al. ............ 438/478 |
| 6,562,703 | B1 | 5/2003 | Maa et al. |

(Continued)

OTHER PUBLICATIONS

N.W. Cheung, W. En, J. Gao, S.S. Iyer, E.C. Jones, B.P. Linder, J.B. Liu, J. Min, B. Shieh, Plasma Immersion Ion Implantation for Electronic Materials Applications ~, Extended Abstract, 1995 International Conference on Solid State Devices and Materials, Osaka, 1995, pp. 351-353.*

(Continued)

*Primary Examiner*—Asok K Sarkar
(74) *Attorney, Agent, or Firm*—Law Office of Gerald Maliszewski; Gerald Maliszewski

(57) ABSTRACT

Transistors fabricated on SSOI (Strained Silicon On Insulator) substrate, which comprises a strained silicon layer disposed directly on an insulator layer, have enhanced device performance due to the strain-induced band modification of the strained silicon device channel and the limited silicon volume because of the insulator layer. The present invention discloses SSOI substrate fabrication processes comprising various novel approaches. One is the use of a thin relaxed SiGe layer as the strain-induced seed layer to facilitate integration and reduce processing cost. Another is the formation of split implant microcracks deep in the silicon substrate to reduce the number of threading dislocations reaching the strained silicon layer. And lastly is a two step annealing/thinning process for the strained silicon/SiGe multilayer film transfer without blister or flaking formation.

18 Claims, 5 Drawing Sheets

U.S. PATENT DOCUMENTS

| | | | |
|---|---|---|---|
| 6,593,625 B2 * | 7/2003 | Christiansen et al. | 257/347 |
| 6,746,902 B2 * | 6/2004 | Maa et al. | 438/149 |
| 6,767,802 B1 * | 7/2004 | Maa et al. | 438/406 |
| 6,780,796 B2 * | 8/2004 | Maa et al. | 438/795 |
| 6,793,731 B2 * | 9/2004 | Hsu et al. | 117/3 |
| 6,841,457 B2 | 1/2005 | Bedell et al. | |
| 6,852,652 B1 * | 2/2005 | Maa et al. | 438/197 |
| 7,018,882 B2 * | 3/2006 | Tweet et al. | 438/199 |
| 7,030,002 B2 * | 4/2006 | Tweet et al. | 438/602 |
| 7,067,430 B2 * | 6/2006 | Maa et al. | 438/705 |
| 7,241,670 B2 * | 7/2007 | Tweet et al. | 438/513 |
| 7,265,030 B2 * | 9/2007 | Maa et al. | 438/458 |
| 7,279,400 B2 * | 10/2007 | Maa et al. | 438/458 |
| 2005/0070115 A1 | 3/2005 | Maa et al. | |

OTHER PUBLICATIONS

Cai et al., *Single crystal Si layers on glass formed by ion cutting*, Journal of Applied Physics, vol. 92, No. 6, Sep. 2002, pp. 3388-3392.

Langdo et al., *Preparation of Novel SiGe-Free Strained Si on Insulator Substrates*, 2002 IEEE SOI Conference, pp. 211-212.

Langdo et al., *SiGe-free strained Si on insulator by wafer bonding and layer transfer*, Applied Physics Letters, vol. 82, No. 24, Jun. 16, 2003, pp. 4256-4258.

Wang et al., *Damage in hydrogen plasma implanted silicon*, Journal of Applied Physics, vol. 90, No. 4, Aug. 2001, pp. 1735-1739.

Yang, *Hydrogen-induced silicon wafer splitting*, Journal of Applied Physics, vol. 94, No. 3, Aug. 2003, pp. 1454-1457.

* cited by examiner

STRAINED SILICON ON INSULATOR FROM FILM TRANSFER AND RELAXATION BY HYDROGEN IMPLANTATION

RELATED APPLICATIONS

This is a Division of U.S. patent application Ser. No. 10/755,615 for Strained Silicon on Insulator from Film Transfer and Relaxation by Hydrogen Implantation, filed Jan. 12, 2004, now U.S. Pat. No. 6,992,025, granted Jan. 31, 2006.

FIELD OF THE INVENTION

This invention relates to integrated circuit (IC) structures and processes, and specifically to an efficient fabrication method of a strained silicon layer on an insulator, yielding a strained silicon-on-insulator (SSOI) structure that is useful for high speed device fabrication.

BACKGROUND OF THE INVENTION

Transistors fabricated on Silicon-On-Insulator (SOI) substrates have significant advantages, such as higher speed, lower power and higher density, over transistors fabricated on bulk silicon wafer substrates. A SOI substrate typically consists of a thin surface layer of single crystal silicon formed on an insulator layer formed on a bulk silicon wafer. The thin surface silicon layer becomes the silicon channel of the transistor, and the insulator layer, usually silicon dioxide, is commonly referred to as the "buried oxide", or BOX.

SOI wafers improve the transistor performance by reducing the operating silicon volume and by isolating the transistors. The thin surface silicon layer limits the volume of silicon which needs to be charged to switch the transistor on and off, and therefore reduces parasitic capacitance of the transistor, and increases the switching speed. The insulator layer isolates the transistor from its neighbors, and therefore reduces the leakage current and allows the transistor to operate at lower supply voltages, thus the transistors may be smaller and more densely packed.

SOI substrates are typically fabricated by oxygen implantation into a single crystal silicon wafer. Recently, a SOI wafer bonding method was introduced in which a wafer having a single crystal silicon surface was tightly joined with a wafer having an insulator surface. The composite substrate is then polished, or etched, until a single crystal silicon thin film remains on the insulating film.

The SOI wafer bonding method provides a new class of SOI substrates, called SSOI (Strained Silicon-On-Insulator) substrates, where the single crystal silicon layer disposed on the insulator substrate is under strain. Transistor devices fabricated on a strained single crystal silicon substrate have been experimentally demonstrated to have enhanced device performance compared to devices fabricated on unstrained silicon substrates. The potential performance improvements are due to the electron and hole mobility enhancements as a result of the introduction of strain-induced band modification of the device channel, resulting in increased device drive current and transconductance, high circuit speed, low operation voltage and low power consumption.

The strained silicon layer is the result of stress imposed on a silicon layer deposited on a seed layer, whose lattice constant is different from that of silicon. For larger/smaller seed layer lattice constants, the silicon layer attempts to extend/contract itself to match the seed layer lattice constant, and experiences biaxial tensile/compressive stress, forming a tensile/compressive strained silicon layer. For example, the lattice constant of germanium is about 4.2 percent greater than that of silicon, and the lattice constant of a silicon-germanium alloy is linear with respect to its germanium concentration. As a result, the lattice constant of a SiGe alloy containing 50% germanium is about 1.02 times greater than the lattice constant of silicon. By depositing an epitaxial silicon layer on a relaxed silicon germanium (SiGe) layer, the epitaxial silicon layer is under tensile strain, and becomes a single crystal strained silicon layer, suitable for transistor device strained channel.

Similar to the SOI bonding technique, the fabrication of SSOI substrate in general comprises the following steps:
1. Preparation of thin strained silicon layer on a silicon substrate by depositing a strain-induced seed layer such as SiGe, followed by a strained silicon layer;
2. splitting ion implantation, usually some form of hydrogen, into the silicon substrate below the strained silicon layer to generate a region of subsurface microcracks;
3. substrate bonding of the silicon substrate to an insulator substrate to create a composite substrate;
4. thermal annealing to grow the subsurface microcracks, which separate the strained silicon layer portion along the hydrogen implantation region from the silicon substrate; and
5. surface polishing of the SSOI substrate to achieve a strained silicon layer smooth surface on the insulator substrate.

A major drawback of prior art SSOI processes is the potential damage to the strained silicon layer because of the proximity of the cleave plane to the strained silicon layer.

The hydrogen splitting implantation dose of about $4\times10^{16}$ should generate sufficient defects and dislocations in the silicon substrate. Although these defects and dislocations are generally located in the silicon substrate, some defects and dislocations may propagate into the strained silicon layer. For plasma immersion ion implantation process, which is an alternative for low cost hydrogen implantation, the damage zone is much broader and thus the strained silicon is more affected. The extension of defects and dislocations may extend into the matrix material, reaching the strained silicon layer in the absence of any interface or boundary.

Also, in the prior art methods to produce a strained silicon layer, conventional practice has been to grow a uniform, or graded, SiGe layer to a few microns to generate sufficient stress wherein misfit dislocations start to form through the SiGe layer to relieve the stress and relax the SiGe layer. However, there are several disadvantages to the growth of a thick SiGe layer. First, with a few micrometer thick SiGe layer, integration is not easy and is not cost effective. Second, the high defect density in a thick SiGe layer, about to $10^4$ cm$^{-2}$ to $10^7$ cm$^{-2}$, may significantly affect the device performance. More importantly, the thickness of this SiGe layer cannot be easily reduced because of the need for a high degree of relaxation for strained silicon applications.

Other disadvantage is the high stress involved in prior art SSOI fabrication processes, including the requirement of a long, low-temperature anneal to enhance the bonding strength, high temperature anneal for splitting the silicon layer, and local non-uniform heating. The formation of blisters and craters, due to high stress relief, in the surface of a silicon wafer implanted with hydrogen ions after annealing is well-known and remains one of the major issues in SSOI fabrication processes. One of the methods to prevent stress built up is to pattern the strained silicon layer, for example, see U.S. Pat. No. 6,767,802, granted Jul. 27, 2004, to Maa et al., for Methods of making relaxed silicon-germanium on insulator via layer transfer, and U.S. Patent Publication No.

2005/0070115 of Maa et al., published Mar. 31, 2005, for Method of making relaxed silicon-germanium on insulator via layer transfer with stress reduction, which are owned by the owner of this Application, and which are hereby incorporated by reference.

SUMMARY OF THE INVENTION

The present invention discloses a method to fabricate a SSOI (Strained Silicon-On-Insulator) substrate in which a strained silicon layer lies directly on an insulator substrate. The present invention SSOI fabrication process addresses various disadvantages of the prior art processes and comprises three novel approaches:

1. Using a thin relaxed SiGe layer as the strain-induced layer. An additional hydrogen implantation and anneal step is employed to foster the relaxation of the SiGe seed layer. Thus the deposited SiGe layer can be in the range of 250 nm to 350 nm, which is much less than the thickness of a few microns reported previously by other inventors. The present invention thin relaxed SiGe layer process offers better integration and is more cost effective.
2. In the wafer splitting step using hydrogen ion implantation, minimization of defects and dislocation in the strained silicon layer by the formation of subsurface microcracks occur far from the strained silicon layer and under the strain-induced layer. By implanting hydrogen ion far into the silicon substrate well below the SiGe layer, the threading dislocations do not propagate easily to the topmost strained silicon layer due to the interface of the substrate silicon and the SiGe layer.
3. A two step annealing/thinning method for the fabrication of SSOI film transfer. Taking advantage of substrate thinning processes that require much less bonding force of the transfer film on the underlying substrate, a two step annealing/thinning method for SSOI fabrication process is successfully developed to reduce blister or flaking formation of the transfer film. The two step annealing/thinning method basically comprises a first anneal at low temperature for wafer splitting, followed by a dry etch process to reduce the thickness of transfer film without loss of adhesion, before subjected the composite substrate to a second anneal at high temperature and a final CMP or selective wet etch.

The present invention SSOI fabrication process can further be adapted for silicon compounds such as carbon doped silicon or carbon doped silicon germanium, or compound semiconductor substrates such as GaAs or InP, or a mix-matched between silicon, silicon compounds and compound semiconductor materials.

BRIEF DESCRIPTION OF THE DRAWINGS

FIGS. 2-1 to 2-10 depict steps in the method of the invention.

DETAILED DESCRIPTION OF THE PREFERRED EMBODIMENTS

Figure 1:
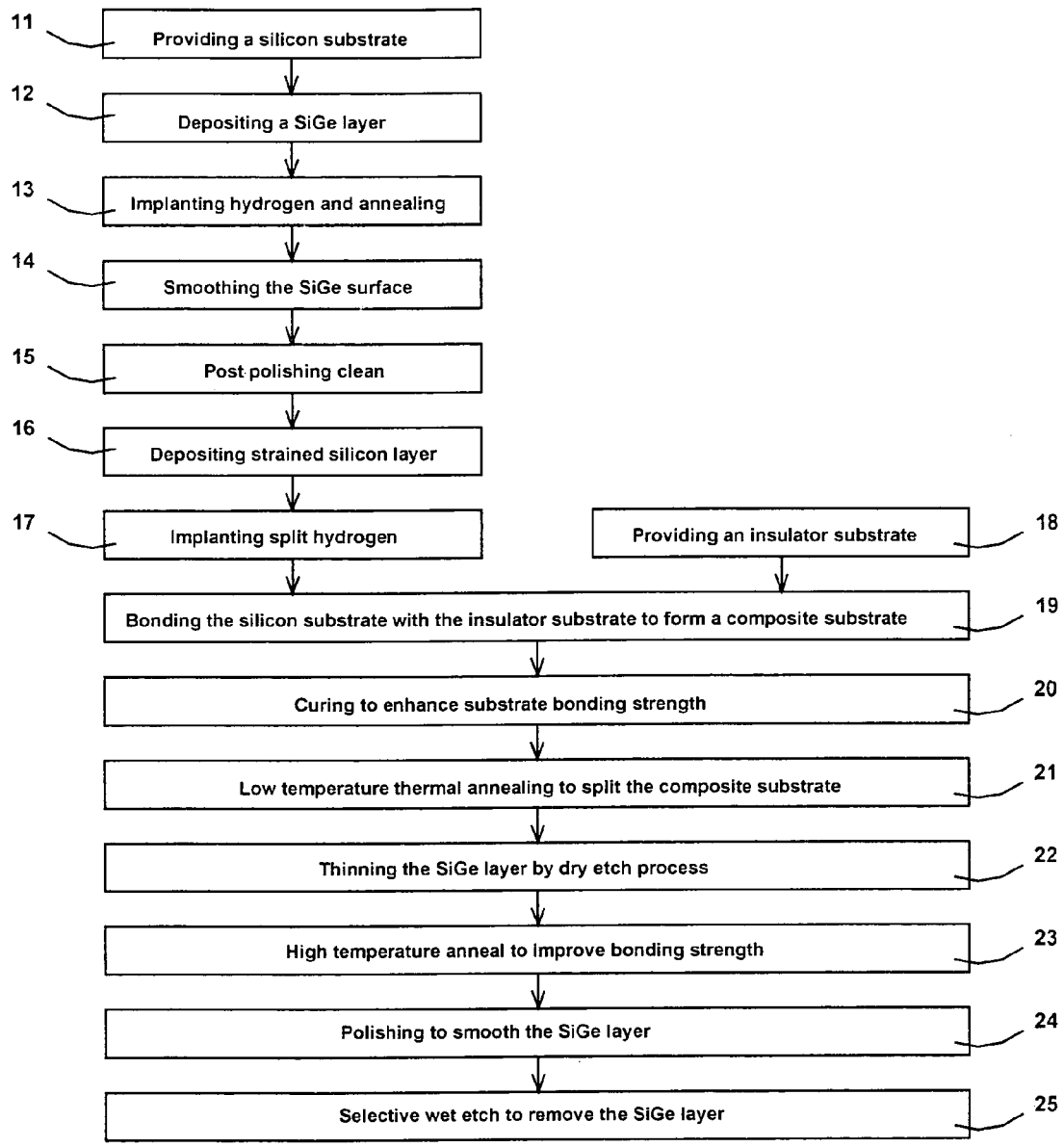
FIG. 1 is a block diagram of the method of the invention.

The novelties of the present invention SSOI fabrication process include: (1) using a thin relaxed SiGe layer as the strain-induced layer; (2) formation of subsurface microcracks far from the strained silicon layer; and (3) film transfer process without blister or flaking formation.

Using a Thin Relaxed SiGe Layer as the Strain-Induced Layer.

The present invention discloses a method to prepare a thin relaxed SiGe layer of less than 500 nm thickness, and preferably about 250 nm to 350 nm with either graded composition or fixed composition, with preferably greater than 20% germanium concentration. The method comprises the steps of depositing a thin SiGe layer, subjecting the SiGe layer to a relaxation implantation of ions, and annealing the implanted SiGe layer to convert the implanted as-deposited compressive SiGe layer to a relaxed SiGe layer.

Since the SiGe is deposited on a silicon substrate, the as-deposited SiGe will be compressively strained by following the lattice constant of the underlying silicon substrate. The relaxation hydrogen ion implant can generate defects and dislocations at the silicon region below SiGe layer, and the anneal step can induce the relaxation of the thin SiGe. The relaxation implant dose is much less than the splitting implant dose, with the objective being the creation of misfit dislocations and not subsurface microcracks.

The disclosed implanted relaxation method can utilize various ion species such as ionized atomic hydrogen ($H^+$), ionized molecular hydrogen ($H_2^+$), helium, boron, silicon, argon or any combinations thereof. Ionized atomic hydrogen ($H^+$) is commonly used but this implantation process is expensive due to the long implantation time. In the present invention, the implanted hydrogen relaxation is preferably by molecular hydrogen ions ($H_2^+$), as disclosed in Maa et al., U.S. Pat. No. 6,562,703, entitled Molecular hydrogen implantation method for forming a relaxed silicon germanium layer with high germanium content, granted May 13, 2003, hereby incorporated by reference. The employment of singly ionized molecular hydrogen ($H_2^+$) implantation in the relaxation of SiGe films results in a reduction in the process time and cost, since this implantation process can be done at double the energy and half the current.

Basically, the method comprises the deposition of a layer of single-crystal SiGe overlying a silicon buffer layer with the thickness of the SiGe layer in the range of 100 nm to 500 nm, together with the implantation with ionized molecular hydrogen ($H_2^+$) in a projected range of approximately 10 nm to 30 nm into the underlying silicon buffer layer, and then annealing the implanted layer to form a thin relaxed SiGe layer. The presence of the silicon buffer layer serves to supply a fresh silicon surface for SiGe growth, but is not absolutely needed.

The use of singly ionized molecular hydrogen ($H_2^+$) to relax strained SiGe films was demonstrated in a series of experiments. Epitaxial SiGe films of approximately 300 nm were deposited, having graded germanium profile, varying linearly from approximately 20% at the SiGe/silicon interface to approximately 30% at the wafer surface. The as-deposited films were strained to be lattice-matched to the silicon substrates. The SiGe films were then implanted with $1 \times 10^{16}$ cm$^{-2}$ to $4.5 \times 10^{16}$ cm$^{-2}$ $H_2^+$ ions at energies from 58 keV to 66 keV and 155 keV, and annealed at 650° C. to 800° C. for nine to thirty minutes in an argon ambient atmosphere.

Nomarski microscopy images of the SiGe surfaces as well as x-ray diffraction (XRD) reciprocal space maps near the Si(224) substrate peak were observed. If the implant is too shallow, the SiGe film has a high degree of lattice relaxation, but the lattice planes are not well-oriented (giving a broad XRD peak) and the surface becomes rough. With higher implant energy (~60 keV) the SiGe film still has a lattice relaxation of more than 80%, but the surface roughness decreases considerably. At even higher implant energies (~155 keV) the film relaxation decreases significantly (~1%) and unchanged even at much longer anneal time, but the surface is very smooth.

The major effect of the relaxation implant is the $H_2^+$ implant depth. At high energy, the defect zone is far down in the silicon region, therefore the source of forming misfit dislocation is too far from the upper SiGe region, and thus almost no relaxation is detected. At low energy, the defect zone is within the SiGe region, thus a high relaxation is achieved, but with a trade off in surface roughness. Therefore by adjusting implant energy and dose, a compromise was found, giving sufficient lattice relaxation while maintaining good crystalline quality and a smooth surface. The preferred projected range of the implanted ions is in the vicinity of the SiGe/silicon substrate interface, and more preferably within 10 to 30 nm into the silicon substrate. Furthermore, the surface roughness due to the surface undulation occurred during SiGe relaxation can be eliminated by a post relaxation polishing such as CMP (Chemical Mechanical Polishing). The relaxed SiGe shows a consistent reliable polishing rate as long as the surface is free from native oxide layer. An additional surface cleaning step after the CMP can be performed, using a modified SC-1 ($H_2O$:$H_2O_2$:$NH_4OH$=5:1:1 solution and its variants) to minimize etching of SiGe, followed by a standard SC-2 ($H_2O$:$H_2O_2$:HCl=5:1:1 solution and its variants) clean. Thus the preferred process is to use low energy to achieve high relaxation, and then subjected the SiGe film to a CMP process to reduce the film roughness.

The novelty of the method of depositing a thin relaxed SiGe is employed in the present invention for the fabrication process of SSOI substrate. By using a thinner SiGe seed layer, various problems of SSOI fabrication process relating to the thick SiGe seed layer mentioned above are eliminated or significantly reduced.

The first embodiment of the present invention SSOI fabrication process employs the fabrication process of a thin relaxed SiGe seed layer and comprises the steps of:
1. preparing a silicon substrate;
2. preparing a thin relaxed SiGe seed layer by ion implantation;
3. depositing a SiGe layer overlying the silicon substrate;
4. implanting ions into the SiGe layer;
5. annealing to convert the SiGe layer to a relaxed SiGe layer;
6. Polishing the SiGe layer surface and performing a post polishing clean;
7. depositing an epitaxial silicon layer on the relaxed SiGe layer, thereby generating a strained silicon layer;
8. transferring the epitaxial silicon/SiGe multilayer to an insulator layer;
9. implanting ions into the epitaxial silicon/SiGe multilayer to generate a defect zone under the epitaxial silicon/SiGe interface;
10. bonding the epitaxial silicon layer surface of silicon substrate to an insulator layer on a second substrate to form a bonded composite substrate; and
11. thermally annealing the composite substrate to split the epitaxial silicon/SiGe multilayer along the defect zone.

The ranges of processes for achieving thin relaxed SiGe by the ion implantation method are that the SiGe concentration is preferably greater than 20% germanium concentration; the SiGe can be graded or constant germanium concentration; the SiGe layer thickness is in the range of 100 nm to 500 nm, preferably between 250 nm to 350 nm; the SiGe deposition temperature is preferably in the range of 400° C. to 600° C.; the implantation dosage of ions is in the range of $2 \times 10^{14}$ cm$^{-2}$ to $2 \times 10^{16}$ cm$^{-2}$ and with an energy in the range of 10 keV to 120 keV; the implantation range is in the vicinity of the interface of the SiGe layer and the silicon substrate, and preferably about 10 nm to 30 nm into the underlying silicon substrate; and the annealing process is at a temperature in the range of 250° C. to 1000° C., for a period of time in the range of 0.1 minute to four hours, or a two step annealing process of a low temperature anneal step (about 250° C., for 10 minutes) following by high-temperature annealing step (about 650° C. to 1000° C. for 0.1-30 minutes); and the thickness of the epitaxial silicon layer is between 10 nm to 100 nm.

Within these process ranges, the method produces a thin (100 nm to 500 nm) relaxed, smooth SiGe film with high germanium content of greater than 20% to serve as a strained-induced seed layer for silicon layer. Further, the $H_2^+$ can be implanted alone, or with boron, helium, silicon, or other species. Furthermore, the traditional technique of single energy beamline implantation or the emerging technique of plasma immersion ion implantation can be used, with various ion species such as ionized molecular hydrogen ($H_2^+$), ionized atomic hydrogen ($H^+$), helium, boron, silicon, argon or any combinations thereof.

The Formation of Subsurface Microcracks Under the Strain-Induced Layer

Prior art splitting ion implantation processes are typically performed at an energy of between 50 keV to 150 keV, normally 90 keV, with a dose of $2 \times 10^{16}$ cm$^{-2}$ to $10^{17}$ cm$^{-2}$, which provides a range of implantation is depth of roughly 0.5 µm to 1 µm. The major drawback of this process is the closeness of the cleave plane to the strained silicon layer, and therefore, although the damage is mostly near the projected range, some defects and dislocations can propagate into the strained silicon layer. With the SiGe seed layer typically in the range of one micron thick, the fact that the split implantation is within the SiGe layer without any interface or boundary further facilitates the extension of dislocations, as shown in *SiGe-free strained Si on insulator by wafer bonding and layer transfer* by Langdo et al., Applied Physics Letters, Vol. 82, Number 24, Jun. 16, 2003, pages 4256-4258, using split implantation inside the SiGe layer with 75 keV, $H_2^+$ species, $4 \times 10^{16}$ dose, and 0.35 µm range.

The presence of the interface between the silicon substrate and the relaxed SiGe layer is found to be a good barrier for the propagation of defects and dislocations. Similar to the relaxation experiments of thin SiGe films, split implantation near the SiGe/silicon interface at 62 keV and far into the silicon substrate at 155 keV show significant differences in the propagation of defects and dislocations after anneal. At 155 keV, the defect zone is about almost 500 nm below the SiGe/silicon substrate interface, resulting in negligible defect propagation reaching the SiGe layer, presumably because the defect zone is far down in the silicon region. The thick silicon layer is expected to restrict the pile up of dislocations to its upper section after wafer splitting, and leave the SiGe layer with very little dislocation.

Based on these experiments, the present invention SSOI fabrication process discloses a process having the split implantation range targeted at about 300 nm to 500 nm below the bulk silicon/SiGe interface. By split implanting deep into the silicon region, which is far from the strained silicon layer, the bulk thickness of the silicon layer together with the silicon/SiGe interface help retard the propagation of defect and dislocations, resulting in a higher quality strained silicon channel layer.

The thin relaxed SiGe makes the deep split implantation easier since similar implantation energy and dose used for the prior art thick SiGe are adequate. The split implant is preferably at energy below 300 keV, and more preferably at around 140 keV, and a dose of between $10^{16}$ cm$^{-2}$ to $2\times10^{17}$ cm$^{-2}$, preferably $4\times10^{16}$ cm$^{-2}$.

The deep implantation process also allows the use of PIII (plasma immersion ion implantation) which may be an alternative for low cost hydrogen implantation since the damage zone is much broader in PIII plasma implanted silicon. Plasma immersion ion implantation is an emerging technology, which promises high dose implantation at low cost and could potentially be used in SSOI fabrication process. In plasma immersion the implant depth is controlled by acceleration voltage, with proper equipment modification to increase acceleration voltage, it can also be used for higher energy implantation. In conventional single energy beamline ion implantation, the damage only occurs near the projected range of the implanted ions, but in hydrogen plasma implanted silicon, the damage layer is quite broad, due to different ion species from the plasma implanted to different depth. By introducing the damage zone well below the bulk silicon/SiGe seed layer interface, plasma immersion ion implantation technique can be applied to the fabrication process of SSOI with less damage to the topmost strained silicon layer.

The second embodiment of the present invention SSOI fabrication process employs the fabrication process of deep split implantation and comprises the steps of:
1. preparing a silicon substrate;
2. preparing a relaxed SiGe seed layer overlying the silicon substrate whereby a silicon/SiGe interface is formed;
3. depositing an epitaxial silicon layer on the relaxed SiGe layer, thereby generating a strained silicon layer;
4. implanting ions into the epitaxial silicon/SiGe multilayer to generate a defect zone below the substrate silicon/SiGe interface wherein the projected range of the implanted ions is about 100 nm to 500 nm into the silicon substrate;
5. transferring the epitaxial silicon/SiGe multilayer to an insulator layer;
6. bonding the epitaxial silicon layer surface of silicon substrate to an insulator layer on a second substrate to form a bonded composite substrate; and
7. thermally annealing the composite substrate to split the epitaxial silicon/SiGe multilayer along the defect zone.

The ranges of processes for achieving SSOI substrate by the deep splitting implantation method are that the implantation dosage of ions is in the range of $10^{16}$ cm$^{-2}$ to $2\times10^{17}$ cm$^{-2}$, preferably $4\times10^{16}$ cm$^{-2}$; and with an energy less than 300 keV, preferably 140 keV; the split annealing process is at a temperature in the range of 350° C. to 1000° C. for a period of time in the range of 0.1 minute to four hours, or a two step annealing process of a low temperature anneal step to split the wafer (about 350° C. to 400° C., for between 30 minutes to four hours) following by high-temperature annealing step (about 450° C. to 1000° C. for between six seconds to one hour); and the thickness of the epitaxial silicon layer is between 10 nm to 100 nm.

The relaxed SiGe can be prepared by the relaxation implantation method as disclosed above. Further, the $H_2^+$ can be implanted alone, or with boron, helium, silicon, or other species. Furthermore, the traditional technique of single energy beamline implantation or the emerging technique of plasma immersion ion implantation can be used, with various ion species such as ionized molecular hydrogen ($H_2^+$), ionized atomic hydrogen ($H^+$), helium, boron, silicon, argon or any combinations thereof.

The Multilayer Film Transfer Process Without Blister or Flaking Formation

One of the major issues with SSOI fabrication process is stress, resulting in blister or flaking formation of the transferred film. For example, in prior art deposition of relaxed SiGe and strained silicon, because of the SiGe stress and low bonding energy, the SiGe layer tends to buckle and wrinkle to relieve the stress.

By understanding the stress issues in SSOI fabrication process, we are able to design and verify the process that would significantly reduce or eliminate the blister or flaking formation to successfully fabricate good SSOI substrates. Specifically, the substrate bonding process requires high temperature anneal to improve the adhesion, and the higher the annealing temperature is, the better the adhesion will be. The ability to sustain high temperature anneal is related to the thickness of the bonded film, and the thinner the transfer film is, the better it could tolerate stress built up resulting from high temperature anneal. Thus thinning the transfer film is essential before the high temperature anneal. Further the adhesion between the bonded substrate resulted from the low temperature anneal is normally not adequate for the conventional substrate thinning methods of polishing (such as Chemical Mechanical Polishing, CMP), or wet etch since these thinning methods require significant bonding strength.

The present invention takes advantage of a substrate thinning process of dry etch that requires much less adhesion of the transfer film on the underlying substrate, and discloses a two step annealing/thinning method for SSOI fabrication process to reduce blister or flaking formation of the transfer film. In general, the method comprises the steps of:
1. first annealing to split wafer at low temperature: low enough not to generate blister and high enough to improve the adhesion. In general, anneal temperature of less than 550° C., preferably less than 400° C., and most preferably at about 375° C., is adequate to prevent formation of wrinkles, blisters and buckling. Annealing at higher than 650° C. is too high because even though there are no buckles or wrinkle, the SiGe film exhibits blisters;
2. first thinning the transfer film by low adhesion etching method, such as a dry etch process, a reactive ion etching process, an ion milling process, or a sputter etch process. The transfer film should be thin enough to sustain the next high temperature anneal, and still thick enough for device and integration purposes, to have adequate thickness uniformity and adequate thickness. The main requirement of this first thinning step is low adhesion etching, and other requirements, such as etch selectivity and etch uniformity, are not critical in this first thinning step;
3. second annealing at high temperature to improve the bonding strength; and
4. second thinning the transfer film by high adhesion etching method, such as CMP or a wet etch. The main requirements of this second thinning step is etch uniformity and etch selectivity to achieve device and integration requirements of VLSI processing.

This two step annealing/thinning process can be applied to thick transfer films, including, but not limiting to, the disclosed process about split implantation deep into the silicon substrate. Even with the thin SiGe layer, by split implantation deep into the silicon substrate, the multilayer film to be transferred is still thick enough to sustain a high temperature anneal needed to improve the substrate bonding. And without the improved substrate bonding, the composite substrate cannot survive the polishing or wet etch step. The present invention two step annealing/thinning process can solve this problem. By annealing at low temperature for wafer splitting, the blister formation is prevented and the bonding is improved enough for a subsequent dry etch process. After the multilayer film is thinned by dry etching, the composite substrate can sustain a high temperature anneal needed to improve the substrate bonding for the next polishing and selective wet etch steps.

To eliminate blister formation, the first anneal of wafer transfer or splitting is preferably carried out at temperature less than 400° C. Typically, it is sufficient to transfer in 60 minutes at 375° C. For deeper splitting implant (such as at 140 keV energy), a longer time, such as two hours, is needed. Temperature seems to be the dominant force, and the addition of a cap layer, such as a thin oxide layer, does not seem to reduce the blister problem. Normally CMP is the preferred method to remove the surface roughness generated from the splitting process, but the film adhesion after the first low temperature anneal is only marginal to withstand the CMP process and the water rinse cycles, therefore CMP is only applied after the second anneal with temperature higher than 650° C. This high temperature anneal could generate blisters in the thick transfer film, and therefore, to avoid blister formation, the film is first thinned down by a dry etch step. The dry etch of reactive ion etching is a preferred method, but other etching step requiring low film adhesion could be used, for example ion milling process, sputter etch process. The second thinning process preferably comprises a CMP step followed by a selective wet etch step.

The selective wet etch, such as etching in a SC-1 solution which has a SiGe/silicon high etch selectivity, is the preferred step to remove the SiGe layer on the strained silicon layer. Following the two step annealing process for wafer splitting and bond strengthening, the strained silicon in SSOI process is very stable. The SSOI substrate is subjected to a steam oxidation at 800° C. for 30 minutes, and further at 900° C. for 30 minutes, XRD results show no degradation of this strained silicon layer.

The Third Embodiment of the Invention

The third embodiment of the present invention SSOI fabrication process employs the two step annealing process and comprises the steps of:
1. preparing a silicon substrate;
2. preparing a relaxed SiGe seed layer overlying the silicon substrate whereby a silicon/SiGe interface is formed;
3. depositing an epitaxial silicon layer on the relaxed SiGe layer, thereby generating a strained silicon layer;
4. implanting ions into the epitaxial silicon/SiGe multilayer to generate a defect zone under the epitaxial silicon/SiGe interface;
5. bonding the epitaxial silicon layer surface of silicon substrate to an insulator layer on a second substrate to form a bonded composite substrate;
6. thermally annealing the composite substrate to split the epitaxial silicon/SiGe multilayer along the defect zone at temperature below 400° C.;
7. dry etching to remove part of the silicon substrate and part of the SiGe layer;
8. thermally annealing the composite substrate to improve the bonding at temperature above 400° C.; and
9. etching the remaining SiGe layer by a polishing process or by selective wet etch process or by a combination of polishing and selective wet etch process. The preferred process is to employ first a polishing step to smooth the split surface, followed by a selective wet etch step to remove completely the SiGe layer.

Fabrication Process of the Invention

The above disclosed novelties can be combined or applied separately to fabricate SSOI substrate in which a strained silicon layer lies directly on an insulator substrate.

FIG. 1 shows the process steps combining all the novelties of the invention. A silicon substrate is prepared (block 11), and a thin layer of SiGe is deposited on the silicon substrate (block 12). The SiGe layer as deposited is under strained due to the lattice mismatch between SiGe and the silicon substrate. The SiGe layer is then subjected to a hydrogen implantation and anneal (block 13) to generate a relaxed SiGe layer. The depth of the relaxation implantation is in the vicinity of the SiGe/silicon interface, and preferably about 10 nm to 30 nm below the SiGe/silicon interface. The relaxed SiGe layer is then subjected to a CMP step (block 14) to smooth the SiGe surface, and then a post CMP clean (block 15). A thin epitaxial silicon layer is deposited on the relaxed SiGe layer (block 16). Since the silicon and relaxed SiGe have different lattice constant, the deposited silicon layer is under strained. Hydrogen ions are implanted (block 17) wherein the depth of hydrogen is below the SiGe/silicon interface by a depth of between about 100 nm to 500 nm below the SiGe/silicon interface. The silicon substrate, together with the SiGe and the strained silicon layer is referred herein as a silicon substrate. Another silicon substrate is also prepared, and thermally oxidized to form a $SiO_2$ layer on the substrate, which is referred to herein as an insulator substrate (block 18). The silicon substrate is bonded to the insulator substrate, with the strained silicon surface in contact with the $SiO_2$, forming a combined structure, also referred to herein as a composite substrate (block 19). The composite substrate is first cured at 150° C. to 250° C. for four to fourteen hours to enhance the wafer bond before splitting (block 20), then split by a first low temperature annealing step (block 21), at temperature below 400° C., producing two modified portions: a first SSOI portion to be continued processing comprises the insulator substrate, the strained silicon layer, the SiGe layer and a part of the silicon substrate layer, hereby called the top silicon substrate layer, and a second portion comprises the bottom part of the silicon substrate, to be discarded. The SSOI portion is dry etched to remove the top silicon substrate layer and a part of the SiGe layer (block 22). A second anneal step (block 23) at high temperature (above 400° C., between 650° C. and 1000° C., and preferably at 650° C.) is performed to increase the bonding adhesion of the existing bonds. Then a CMP step is performed to smooth the SiGe layer surface (block 24). Finally, the substrate is wet etched selectively to remove the entire SiGe layer (block 25), leaving only the strained silicon layer on an insulator substrate. Detailed pictorials of the process steps are described in FIG. 2.

Figures 1, 2:
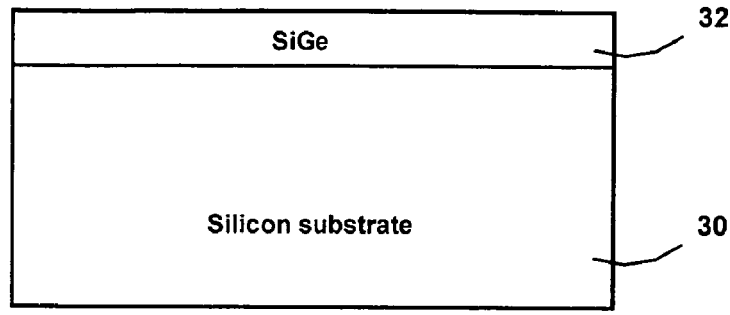
Figure 2:
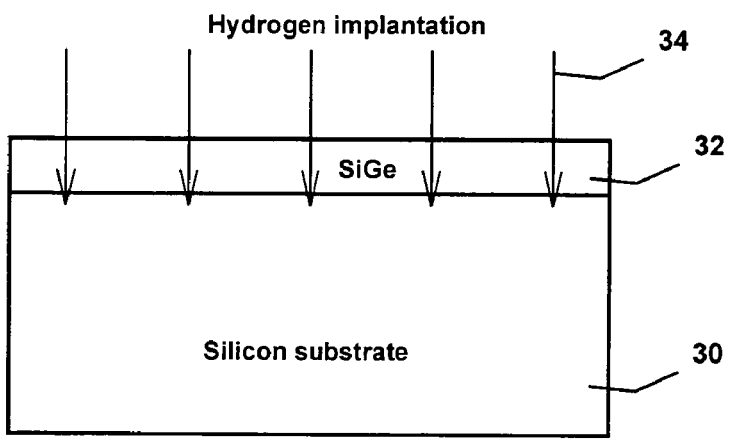

FIG. 2-1 shows a silicon substrate 30 being prepared, with a layer 32 of SiGe epitaxially deposited on silicon substrate 30. The germanium concentration is above 20%, and preferably in the range of between 20% to 60%, and can be graded or uniform throughout. The SiGe thickness is between 100 nm to 500 nm, and preferably between 250 nm and 350 nm. The SiGe is under biaxial compression strain and no relaxation occurs at this time. The SiGe deposition is typically carried out at a deposition temperature between 400° C. and 600° C.

FIG. 2-2 depicts the hydrogen ion 34 implantation and subsequent annealing step to induce relaxation of the deposited SiGe film in which hydrogen ions, either $H^+$ or $H_2^+$, are implanted through the SiGe film. The dose range is between about $2\times10^{14}$ $cm^{-2}$ to $2\times10^{16}$ $cm^{-2}$, and the energy range is between about 10 keV to 120 keV. The implantation range is in the vicinity of the interface of the SiGe layer and the silicon substrate, and preferably about 10 nm to 30 nm into the underlying silicon substrate, and the annealing process is at a temperature in the range of 350° C. to 1000° C., for a period of time in the range of six seconds to four hours, or a two step annealing process of a low-temperature anneal step (about 350° C. to 400° C., for between ten minutes to four hours) followed by a high-temperature annealing step (about 450° C. to 1000° C., for between six seconds to one hour). After this implantation and anneal step, the SiGe layer is relaxed, and with the possibility of a rough surface.

Figures 2, 3:
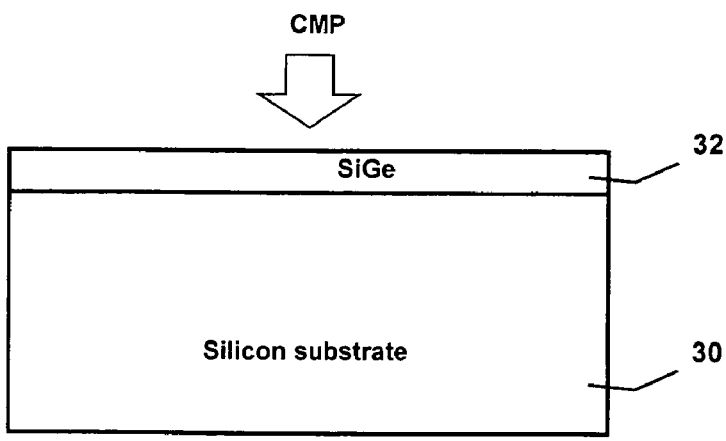

FIG. 2-3 depicts the CMP of the relaxed SiGe surface and post CMP clean. 50 nm of SiGe surface removal should be sufficient to obtain a smooth surface, with 10 nm to 30 nm being the preferred thickness of the removed SiGe.

Figures 2, 3, 4:
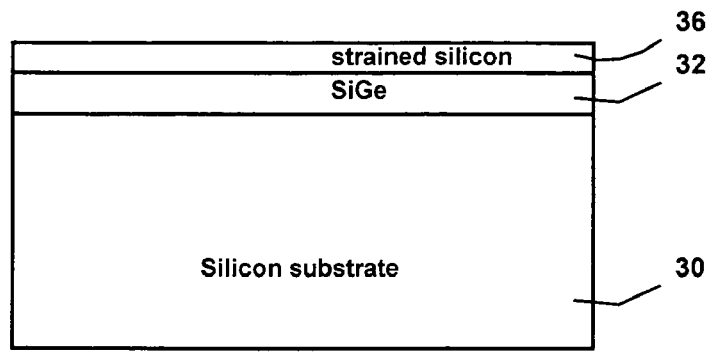
Figures 2, 3, 4, 5:
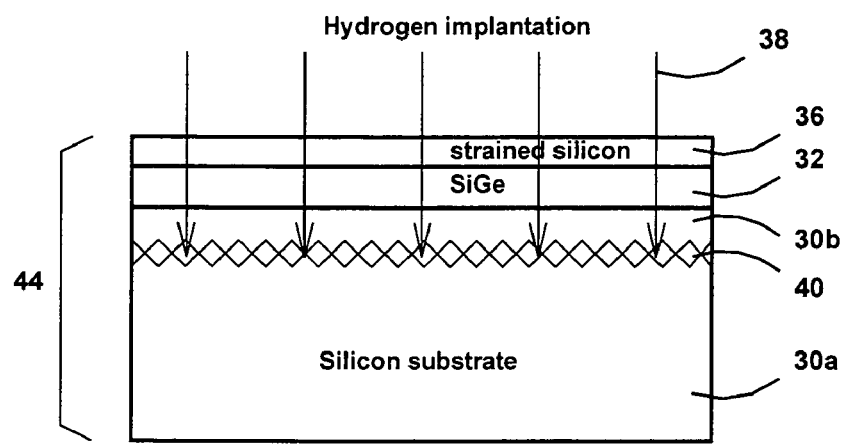
Figures 2, 3, 4, 5, 6:
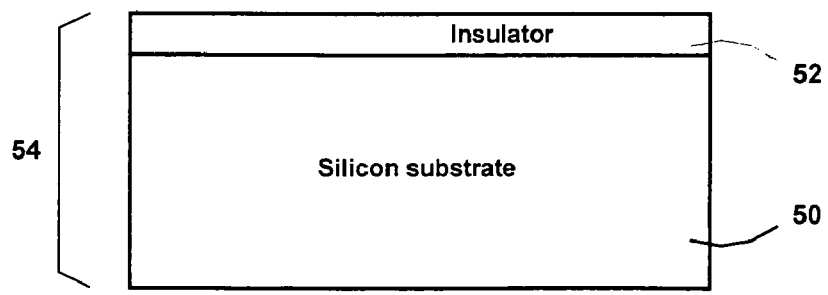
Figures 2, 3, 4, 5, 6, 7:
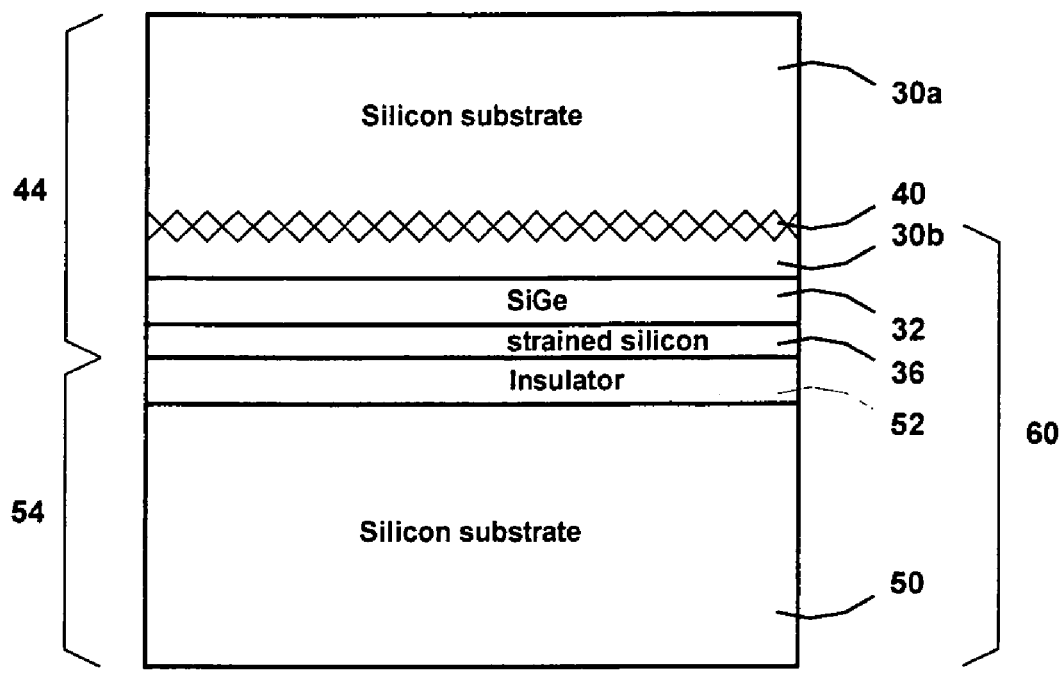
Figures 2, 3, 4, 5, 6, 7, 8:
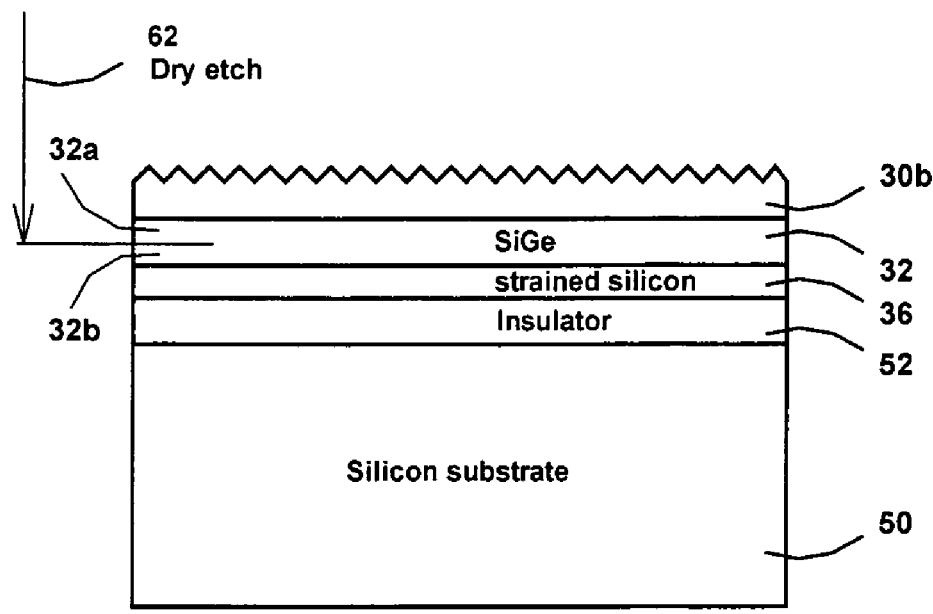
Figures 2, 3, 4, 5, 6, 7, 8, 9:
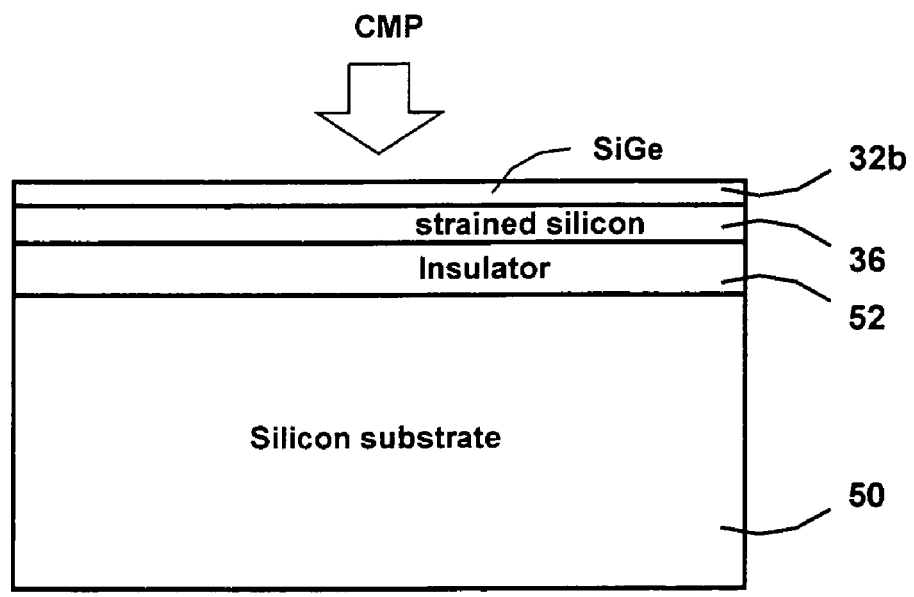
Figures 2, 3, 4, 5, 6, 7, 8, 9, 10:
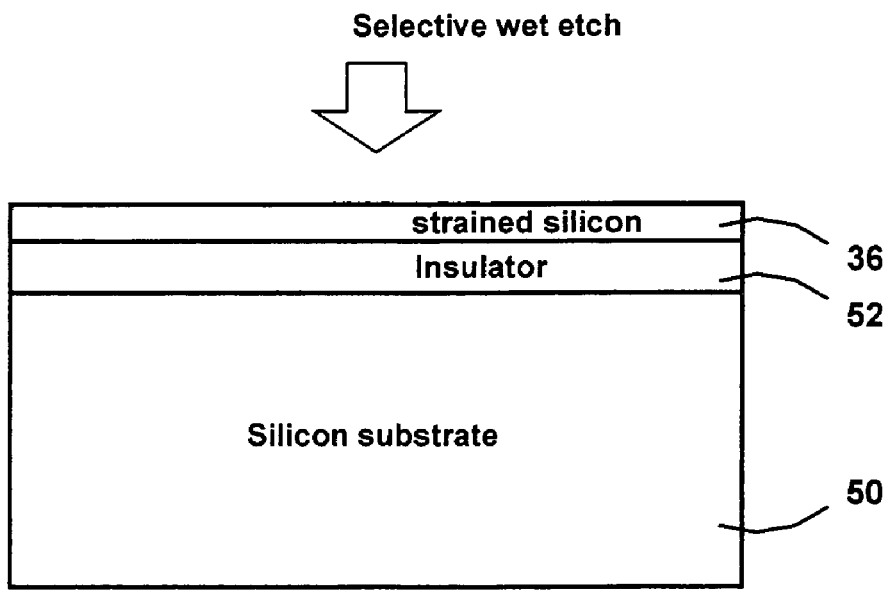

FIG. 2-4 depicts the epitaxial silicon layer deposition. Since the underlayer film is the relaxed SiGe with a lattice constant larger than silicon, the deposited epitaxial silicon 36 is under tensile strained. The thickness of the deposited epitaxial silicon layer is preferably between 10 nm to 100 nm.

FIG. 2-5 depicts the hydrogen ion 38 implantation for wafer splitting wherein hydrogen ions, either $H^+$ or $H_2^+$, are implanted through the SiGe film. The dose range is between about $10^{16}$ $cm^{-2}$ to $5 \times 10^{17}$ $cm^{-2}$, preferably $4 \times 10^{16}$ $cm^{-2}$ of $H_2^+$, and the energy is below 300 keV, preferably about 140 keV. The range of hydrogen implantation is well into the silicon substrate, from about 300 nm to 500 nm below the SiGe/substrate silicon interface. The implanted hydrogen ions form a microcrack defect region 40, separating the silicon substrate 30 into a bulk silicon substrate 30a and a top silicon substrate 30b on either side thereof. This structure is referred to herein as the silicon substrate 44.

FIG. 2-6 depicts the preparation of an insulator substrate 54, which is another silicon substrate being thermally oxidized to produce a $SiO_2$ layer 52 over a silicon substrate 50.

FIG. 2-7 depicts the bonding of the silicon substrate 44 to the insulator substrate 54. Note that the silicon substrate 44 is drawn up side down as compared to previous figure. The composite substrate is formed by direct wafer bonding. In direct wafer bonding, the surfaces of both portions are cleaned in a modified SC-1 ($H_2O:H_2O_2:NH_4OH=5:1:1$) cleaning solution and rinsed in distilled water. After drying, at less than 900° C., both surfaces are hydrophilic. The dried, hydrophilic-exposed portions facing one another, are brought into contact at ambient temperature. The bonding is initialized in a small area of the touching wafers by slightly pressing the wafers together. The bonded area quickly spreads over the entire in-contact surfaces, within a few seconds. The bonded substrates can be cured at a temperature of between about 150° C. to 250° C. for between about one hour to fourteen hours to improve the surface bonding.

FIG. 2-8 depicts substrate splitting by first low temperature annealing at a temperature below 400° C., preferably 375° C., for between about 30 minutes to four hours, to separate the multilayer of strained silicon layer 36, relaxed SiGe layer 32 and top silicon substrate layer 30b along the hydrogen split implant region 40 from the silicon substrate portion 30a. The splitting results in a SSOI portion 60 to be continued processing to produce the SSOI substrate, and a silicon substrate portion 30a. The first anneal is performed at low temperature to prevent film blistering. After the split, a dry etch process is performed to remove the top silicon substrate layer 30b and a part 32a of the SiGe layer 32. The transfer films now comprise the strained silicon layer 36 and the bottom part of the SiGe layer 32b. This dry etch step is to reduce the thickness of the transfer layer so that no blister will form in the subsequent bond strengthening high temperature anneal step. Wet etch or CMP is not desirable at this time due to the possibility of film lifting from weak bond.

FIG. 2-9 shows the SSOI portion after the dry etch process. The second annealing step is then performed to increase the bonding strength. This step is essential to ensure that the bond is strong enough to withstand the following CMP and wet etch step. The anneal is performed at a temperature of between about 500° C. to 900° C. for between about ten minutes to sixty minutes in an inert atmosphere. CMP step is performed to smooth the split surface. The CMP step removes most of the SiGe layer 32b, resulting in a much thinner and very smooth SiGe layer to facilitate the subsequent selective wet etch process.

FIG. 2-10 depicts a selective wet etch step to remove all remaining SiGe layer without significant damage to the strained silicon layer 36. The wet etch can be performed in a SC-1 solution. The final SSOI substrate comprises a strained silicon layer 36 lying directly on an insulator 52 on a silicon substrate 50.

The fabrication of the disclosed SSOI substrate can be accomplished by semiconductor fabrication process technology as disclosed above. Although illustrated and described below with reference to certain specific fabrication processes, the present invention is nevertheless not intended to be limited to the details shown. The general process of semiconductor fabrication has been practiced for many years, and due to the multitude of different ways of fabricating a device or structure, various modifications may be made in the fabrication process details within the scope and range of the present invention and without departing from the meaning of the invention.

For example, the present invention discloses a SSOI fabrication process employed strained silicon structure. However, the disclosed invention is not limited to just silicon, but the scope of the invention can be applied to silicon compounds such as silicon germanium, carbon doped silicon, carbon doped silicon germanium, compound semiconductor substrates such as GaAs or InP, or a mix-matched between silicon, silicon compounds and compound semiconductor materials Alternatively, the process of causing the wafer splitting can be accomplished by directly excites the implanted ions or molecular ions by the high frequency alternating electric or electromagnetic field to increase the collision frequency, see Lee, U.S. Pat. No. 6,486,008, entitled Manufacturing method of a thin film on a substrate, granted Nov. 26, 2002, which is hereby incorporated by reference.

Also, the introduction of an etch stop layer can be used to facilitate the smoothing and etching of the SiGe seed layer. By using the etch stop layer, the need for CMP is avoided and the final device thickness, uniformity, and smoothness are based upon the deposited film instead of CMP parameters. The etch stop material is chosen so that it can be etched selectively as compared to the substrate material, for example, a high doped ($p^+$ or $n^+$) silicon layer, a silicon-germanium (SiGe) layer, a strained SiGe layer, or a germanium layer can be used as an etch stop layer. See Srikrishnan, U.S. Pat. No. 5,882,987, entitled Smart-cut process for the production of thin semiconductor material films, granted Mar. 16, 1999, which is hereby incorporated by reference.

Further, the substrate bonding process can be performed without the treatment of hydrophilicity, see Yamagata et al., U.S. Pat. No. 6,156,624, Method for production of SOI substrate by pasting and SOI substrate, granted Dec. 5, 2000, which is hereby incorporated by reference.

We claim:

1. A method of forming a strained silicon layer on an insulator substrate comprising
providing a silicon substrate;
preparing a relaxed SiGe layer directly on the silicon substrate whereby a silicon/SiGe interface is formed between the silicon substrate and the relaxed SiGe layer;
depositing an epitaxial silicon layer directly on the relaxed SiGe layer to form an epitaxial silicon/SiGe multilayer;
implanting splitting ions into the epitaxial silicon/SiGe multilayer to generate a defect zone below the silicon/SiGe interface wherein the projected range of the implanted ions is about 100 nm to 500 nm into the silicon substrate; and
transferring the epitaxial silicon/SiGe multilayer to an insulator substrate.

2. A method as in claim 1 wherein the splitting ion implantation is performed by plasma immersion ion implantation.

3. A method as in claim 1 wherein the implanted splitting ions are molecular hydrogen ions ($H_2^+$).

4. A method as in claim 1 wherein the implanted splitting ions are taken from the group of ions consisting of hydrogen atom ions ($H^+$), helium ions, boron ions, silicon ions, argon ions, and any combinations thereof.

5. A method as in claim 1 wherein the dosage of the implanted splitting ions is in the range of $10^{16}$ cm$^{-2}$ to $2\times10^{17}$ cm$^{-2}$, and the energy of the implanted splitting ions is in less than 300 keV.

6. A method as in claim 1 further comprising an additional implantation of the SiGe layer with a species of ions selected from the group of ions consisting of boron ions, helium ions and silicon ions, with the dosage range of $10^{12}$ to $10^{15}$ cm$^{-2}$, and wherein the implantation takes place before or after the splitting ion implantation.

7. A method as in claim 1 wherein the thickness of the epitaxial silicon layer is in the range of 10 nm to 100 nm.

8. A method as in claim 1 wherein transferring the epitaxial silicon/SiGe multilayer to an insulator substrate comprises
bonding the epitaxial silicon layer surface of silicon substrate to an insulator layer on a second substrate to form a bonded composite substrate; and
thermally annealing the composite substrate to split the epitaxial silicon/SiGe multilayer along the defect zone.

9. A method as in claim 1 wherein preparing a relaxed SiGe layer directly on the silicon substrate comprises
depositing a SiGe layer directly on the silicon substrate whereby a silicon/SiGe interface is formed;
implanting relaxing ions into the SiGe layer; and
annealing to convert the SiGe layer to a relaxed SiGe layer, having a thickness of between about 250 nm to 350 nm.

10. A method of forming a strained silicon layer on an insulator substrate comprising
providing a silicon substrate;
preparing a relaxed SiGe layer to a thickness of between about 250 nm to 350 nm directly on the silicon substrate whereby a silicon/SiGe interface is formed between the silicon substrate and the relaxed SiGe layer;
depositing an epitaxial silicon layer to a thickness of between about 10 nm to 30 nm directly on the relaxed SiGe layer;
implanting splitting ions into the epitaxial silicon/SiGe multilayer to a depth of between about 100 nm to 500 nm into the silicon substrate to generate a defect zone below the silicon/SiGe interface;
bonding the epitaxial silicon layer surface to an insulator layer on a second substrate to form a bonded composite substrate;
low temperature annealing the bonded composite substrate to split the epitaxial silicon/SiGe multilayer along the defect zone at a temperature below 400° C.;
dry etching to remove a portion of the silicon substrate and a portion of the SiGe layer;
high temperature annealing the composite substrate to improve the bonding at temperature above 400° C.; and
etching the remaining SiGe layer by a process taken from the group of processes consisting of a polishing process, a selective wet etch process, and by a combination of polishing and selective wet etch processes.

11. A method as in claim 10 wherein the splitting ion implantation is performed by plasma immersion ion implantation.

12. A method as in claim 10 wherein the implanted splitting ions comprise molecular hydrogen ions ($H_2^{30}$).

13. A method as in claim 10 wherein the implanted splitting ions are taken from the group of ions consisting of hydrogen atom ions ($H^+$), helium ions, boron ions, silicon ions, argon ions, and any combinations thereof.

14. A method as in claim 10 further comprising an additional implantation of the SiGe layer with a species of ions selected from the group of ions consisting of boron ions, helium ions and silicon ions, with the dosage range of $10^{12}$ to $10^{15}$ cm$^{-2}$, and wherein the implantation takes place before or after the splitting ion implantation.

15. A method as in claim 10 wherein the low temperature annealing time is less than 4 hours.

16. A method as in claim 10 wherein the high temperature annealing time is less than 1 hour.

17. A method as in claim 10 wherein the dosage of the implanted splitting ions is in the range of $10^{16}$ cm$^{-2}$ to $2\times10^{17}$ cm$^{-2}$, and wherein the energy of the implanted splitting ions is less than 300 keV.

18. A method as in claim 10 wherein preparing a relaxed SiGe layer directly on the silicon substrate comprises
depositing a SiGe layer directly on the silicon substrate whereby a silicon/SiGe interface is formed;
implanting relaxing ions into the SiGe layer; and
annealing to convert the SiGe layer to a relaxed SiGe layer.

* * * * *

UNITED STATES PATENT AND TRADEMARK OFFICE
CERTIFICATE OF CORRECTION

PATENT NO. : 7,390,725 B2 Page 1 of 1
APPLICATION NO. : 11/284326
DATED : June 24, 2008
INVENTOR(S) : Jer-shen Maa et al.

It is certified that error appears in the above-identified patent and that said Letters Patent is hereby corrected as shown below:

In claim 12, the symbol for "molecular hydrogen ions" has incorrectly been printed as "$H_2^{30}$". The symbol should be printed as --$H_2^+$--.

Claim 12 should appear as follows:

Claim 12. A method as in claim 10 wherein the implanted splitting ions comprise molecular hydrogen ions ($H_2^+$).

Signed and Sealed this

Twenty-sixth Day of August, 2008

JON W. DUDAS
*Director of the United States Patent and Trademark Office*

UNITED STATES PATENT AND TRADEMARK OFFICE
CERTIFICATE OF CORRECTION

PATENT NO. : 7,390,725 B2 Page 1 of 1
APPLICATION NO. : 11/284326
DATED : June 24, 2008
INVENTOR(S) : Jer-shen Maa et al.

It is certified that error appears in the above-identified patent and that said Letters Patent is hereby corrected as shown below:

In claim 12, the symbol for "molecular hydrogen ions" has incorrectly been printed as "$H_2^{30}$". The symbol should be printed as --$H_2^+$--.

Column 14, claim 12, lines 28 and 29, should appear as follows:

Claim 12. A method as in claim 10 wherein the implanted splitting ions comprise molecular hydrogen ions ($H_2^+$).

This certificate supersedes the Certificate of Correction issued August 26, 2008.

Signed and Sealed this

Sixteenth Day of September, 2008

JON W. DUDAS
*Director of the United States Patent and Trademark Office*